United States Patent
Kim et al.

(10) Patent No.: US 7,205,656 B2
(45) Date of Patent: Apr. 17, 2007

(54) STACKED DEVICE PACKAGE FOR PERIPHERAL AND CENTER DEVICE PAD LAYOUT DEVICE

(75) Inventors: Dalson Ye Seng Kim, Singapore (SG); Chong Chin Hui, Singapore (SG); Lee Wang Lai, Singapore (SG); Roslan Bin Said, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/064,107

(22) Filed: Feb. 22, 2005

(65) Prior Publication Data

US 2006/0197206 A1    Sep. 7, 2006

(51) Int. Cl.
*H01L 23/34* (2006.01)
(52) U.S. Cl. ........................ 257/723; 257/777
(58) Field of Classification Search ............... 257/723, 257/777, 678
See application file for complete search history.

(56) References Cited

U.S. PATENT DOCUMENTS

| | | | |
|---|---|---|---|
| 5,323,060 A | 6/1994 | Fogal et al. | |
| 5,674,785 A | 10/1997 | Akram et al. | |
| 5,719,440 A | 2/1998 | Moden | |
| RE36,613 E | 3/2000 | Ball | |
| 6,051,886 A | 4/2000 | Fogal et al. | |
| 6,212,767 B1 | 4/2001 | Tandy | |
| 6,218,202 B1 | 4/2001 | Yew et al. | |
| 6,337,226 B1 | 1/2002 | Symons | |
| 6,388,313 B1 | 5/2002 | Lee et al. | |
| 6,472,736 B1 | 10/2002 | Yeh et al. | |
| 6,525,412 B2 | 2/2003 | Noshita | |
| 6,569,709 B2 | 5/2003 | Derderian | |
| 6,696,748 B1 | 2/2004 | Thurgood | |
| 6,744,137 B2 | 6/2004 | Kinsman | |
| 6,744,141 B2 * | 6/2004 | Kimura | 257/777 |
| 6,773,960 B2 | 8/2004 | Fee et al. | |
| 6,777,799 B2 | 8/2004 | Kikuma et al. | |
| 6,914,267 B2 * | 7/2005 | Fukasawa et al. | 257/98 |
| 2002/0053727 A1 * | 5/2002 | Kimura | 257/686 |
| 2003/0038354 A1 | 2/2003 | Derderian | |
| 2004/0164413 A1 | 8/2004 | Hall et al. | |

* cited by examiner

*Primary Examiner*—Roy Potter
(74) *Attorney, Agent, or Firm*—TraskBritt

(57) ABSTRACT

An assembly method is disclosed that includes providing a substrate, securing a first semiconductor device on a first surface thereof, and superimposing at least a second semiconductor device at least partially over the first semiconductor device is disclosed. An outer peripheral portion of the second semiconductor device overhangs both the first semiconductor device and the substrate. Discrete conductive elements are placed between the outer peripheral portion of the second semiconductor device and a second surface of the substrate. Intermediate portions of the discrete conductive elements pass outside of a side surface of the substrate. Assemblies and packaged semiconductor devices that are formed in accordance with the method are also disclosed.

30 Claims, 14 Drawing Sheets

STACKED DEVICE PACKAGE FOR PERIPHERAL AND CENTER DEVICE PAD LAYOUT DEVICE

BACKGROUND OF THE INVENTION

1. Field of the Invention

The present invention relates to the packaging of electronic components such as integrated circuits or other electronic devices. In particular, this invention relates to a stacked semiconductor device package wherein a substrate of the stacked semiconductor package is smaller than at least one semiconductor device of the stacked semiconductor package.

2. State of the Art

In order to conserve the amount of surface area, or "real estate," consumed on a carrier substrate, such as a circuit board, by semiconductor devices connected thereto, various types of increased density packages have been developed. Among these various types of packages is the so-called "multi-chip module" (MCM). Some types of multi-chip modules include assemblies of semiconductor devices that are stacked one on top of another. The amount of surface area on a carrier substrate that may be saved by stacking semiconductor devices is readily apparent; a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), the incorporation of different types of functionality into a single semiconductor device has proven very difficult to actually reduce to practice. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated independently and later assembled with one another much more quickly and cost-effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the even larger carrier substrate, and a second, smaller semiconductor device positioned over and secured to the first semiconductor device. The second, smaller semiconductor device does not overlie bond pads of the first semiconductor device and, thus, the second semiconductor device does not cover bond wires that electrically connect bond pads of the first semiconductor device to corresponding contacts or terminals of the carrier substrate. Thus, the carrier substrate must be even larger than the first, larger semiconductor device for electrical connection thereto. Such a multi-chip module is disclosed and illustrated in U.S. Pat. No. 6,212,767, issued to Tandy on Apr. 10, 2001 (hereinafter "the '767 Patent"). Notably, since sizes of the semiconductor devices of such a multi-chip module must continue to decrease as they are positioned increasingly higher on the stack, the obtainable heights of such multi-chip-modules become severely limited.

Another example of a conventional multi-chip module is described in U.S. Pat. No. 5,323,060, issued to Fogal et al. on Jun. 21, 1994 (hereinafter "the '060 Patent"). The multi-chip module of the '060 Patent includes a carrier substrate with semiconductor devices disposed thereon in a Chip-On-Board ("COB") stacked arrangement. The individual semiconductor devices of each multi-chip module may be the same size or different sizes, with upper semiconductor devices being either smaller or larger than underlying semiconductor devices. Adjacent semiconductor devices of each of the multi-chip modules disclosed in the '060 Patent are secured to one another with an adhesive layer. The thickness of each adhesive layer well exceeds the loop heights of wire bonds protruding from a semiconductor device upon which that adhesive layer is to be positioned. Accordingly, the presence of each adhesive layer prevents the back side of an overlying, upper semiconductor device from contacting bond wires that protrude from an immediately underlying, lower semiconductor device of the multi-chip module. The carrier substrate is larger than the semiconductor devices, and the bond wires are bonded to the carrier substrate on regions peripheral to the stacked semiconductor devices. It does not appear that the inventors named on the '060 Patent were concerned with the size of the carrier substrate or the length of the bond wires. Thus, the multi-chip modules of the '060 Patent may have an undesirably large foot print and undesirably long bond wires due to the peripheral wire bond connections. A multi-chip module having a large foot print may restrict the routing space for external circuitry, for example a printed circuit board. Long bond wires result in more potential for interwire contact and shorting, and more inductance.

Other suitable techniques used for bonding and electrically connecting a semiconductor device to a substrate are flip-chip attachment and Board-On-Chip ("BOC") assembly.

Flip-chip attachment generally consists of attaching an active surface of a semiconductor device to a substrate with a plurality of conductive bumps therebetween. Each conductive bump must align and correspond with respective bond pads on the substrate and the semiconductor device to provide electrical interconnection therebetween. The semiconductor device is bonded to the substrate by reflowing the conductive bumps, after which an underfill material is typically disposed between the semiconductor device and the substrate for environmental protection and to enhance the attachment of the semiconductor device to the substrate.

Turning to the BOC assembly, the semiconductor device may be attached to the surface of a substrate in a face down orientation (with its active surface and bond pads down with respect to the circuit board). In this orientation, the active surface of the device is adhesively attached to a portion of the substrate having one or more wire bonding openings therein, so that bond wires can extend through the opening from bond pads on the substrate to bond pads on the active surface of the device. A bond wire is then discretely attached to each bond pad on the semiconductor device and extends to a corresponding bond pad on the substrate. The bond wires are generally attached through one of three industry-standard wire bonding techniques: ultrasonic bonding, using a combination of pressure and ultrasonic vibration bursts to form a metallurgical cold weld; thermocompression bonding, using a combination of pressure and elevated temperature to form a weld; and thermosonic bonding, using a combination of pressure, elevated temperature, and ultrasonic vibration bursts. An encapsulant is typically used to cover the bond wires to prevent contamination. For an exemplary BOC assembly, see U.S. Pat. No. 5,719,440, issued to Moden on Feb. 17, 1998, and assigned to the assignee of the present invention, which discloses the device adhesively attached face (active surface) down to a substrate with wire bonding through an opening in the substrate.

This face down semiconductor device orientation is advantageous by allowing shorter wire bonds. However, a conventional multi-chip module having a first semiconductor device on a substrate in a BOC assembly includes a second semiconductor device stacked thereover and a carrier substrate larger than both the first semiconductor device and the second semiconductor device. Bond wires electrically connecting the second semiconductor device and the carrier substrate are bonded to the carrier substrate on regions peripheral to the stacked semiconductor devices. For example, see U.S. Pat. No. 6,472,736 issued to Yeh et al. on Oct. 29, 2002.

In view of the foregoing, it appears that a method for forming stacked semiconductor device assemblies which enables the use of shorter bond wires and a substrate smaller relative to the semiconductor devices would be useful.

BRIEF SUMMARY OF THE INVENTION

The present invention, in a number of exemplary embodiments, includes semiconductor device assemblies, as well as a method for assembling semiconductor devices in a stacked arrangement.

In one aspect of the present invention, a semiconductor device assembly includes a substrate having a first surface, a second, opposing surface, and at least one side surface adjacent to the first surface and the second surface. A first semiconductor device is disposed on the first surface of the substrate, and a second semiconductor device is positioned over the first semiconductor device. An active surface of the second semiconductor device faces the first semiconductor device, and a plurality of discrete conductive elements is operably coupled to the second semiconductor device active surface and the substrate second surface. At least a portion of some of the second plurality of discrete conductive elements extend beyond the at least one side surface of the substrate.

Portions of the active surface of the second semiconductor device may overhang both the first semiconductor device and the substrate. The perimeter of the second semiconductor device active surface may be longer than the perimeter of a surface of the first semiconductor device and of the first surface of the substrate. In one exemplary embodiment, the second semiconductor device active surface may have a surface area larger than either a surface area of a surface of the first semiconductor device or a surface area of the first surface of the substrate.

The first semiconductor device may be attached to the substrate with the active surface facing the substrate or with the active surface facing the second semiconductor device. Electrical communication between the first semiconductor device and the substrate may be established in the form of discrete conductive elements extending through a slot in the substrate, conductive bumps positioned therebetween, discrete conductive elements extending from the active surface of the first semiconductor device and the first surface of the substrate, or using an interposer. The first semiconductor device may be positioned with the active surface facing the substrate, with portions of the active surface overhanging the substrate. Discrete conductive elements may extend past the outer periphery of the substrate and attach to the second, opposing surface of the substrate.

In another exemplary embodiment, a semiconductor device assembly includes a central semiconductor device, positioned between the first semiconductor device and the second semiconductor device. An active surface of the central semiconductor device may face the first semiconductor device, or face the second semiconductor device. Spacers may separate the semiconductor devices, allowing clearance for bond wires connected thereto. Electrical communication between the central semiconductor device and the substrate may be established in the form of discrete conductive elements extending directly thereto, or through intermediate conductive elements on the first semiconductor device.

Once the semiconductor devices of such an assembly have been assembled with one another and electrically connected with a substrate or with one another, the assembly may be packaged by encapsulation as known in the art using, for example, transfer molding, injection molding, pot molding or stereolithographic techniques. The encapsulation may fully cover a back side surface of the second semiconductor device, or partially cover the back side surface of the second semiconductor device, leaving portions of the back side surface of the second semiconductor device exposed.

One embodiment of a method for forming an assembly according to the present invention includes providing a substrate including a first surface, a second, opposing surface, and at least one side surface adjacent the first surface and the second surface, securing a first semiconductor device to the first surface of the substrate, superimposing a second semiconductor device including an active surface over the first semiconductor device, the active surface of the second semiconductor device facing the substrate, wherein an outer peripheral portion of the second semiconductor device including bond pads positioned thereon overhangs the substrate, and placing a plurality of discrete conductive elements between the bond pads and the second surface of the substrate with intermediate portions of the discrete conductive elements passing outside the at least one side surface of the substrate.

Other features and advantages of the present invention will become apparent to those of skill in the art through consideration of the ensuing description, the accompanying drawings and the appended claims.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

As will be appreciated by those of ordinary skill in the art, the present invention contemplates a stacked device package wherein an active surface of at least one semiconductor device of the stacked device package has an outer periphery extending laterally beyond the outer periphery of a surface of a substrate of the stacked semiconductor package. Further, the active surface of the at least one semiconductor device may be oriented facing the substrate. The at least one semiconductor device may include peripherally located bond pads that are wire bonded to the substrate. At least another semiconductor device may be positioned between the substrate and the at least one semiconductor device. Such a configuration may provide a stacked device package with a smaller package size than a conventional stacked device package having a semiconductor device of a size similar to that of the at least one semiconductor device. The stacked device package of the present invention may include a substrate having a small surface area that does not restrict the routing space on external circuitry, for example a printed circuit board. The footprint of solder balls for electrically connecting the package to the external circuitry may conform to standard sizes and configurations, for example a Joint Electronic Device Engineering Council (JEDEC) standard. Additionally, the small foot print may enable a single routing layer design to be employed on the printed circuit board.

The discrete conductive elements, such as bond wires, used to electrically connect the semiconductor devices and substrate of the stacked device package of the present invention may be shorter than the bond wires required to connect a stacked device package having a COB configuration. Shorter bond wires may be preferable as exhibiting a smaller inductance value compared to longer bond wires. A stacked device package of the present invention may be manufactured and packaged using existing equipment. The stacked device package of the present invention enables the length of traces on the semiconductor devices to be matched. There is a benefit to matching trace length when double data rate (DDR) memory is used. In DDR the command and address signals are synchronized with the clock; therefore, it is important to match the length of these traces to match signal propagation delays.

Figure 1A:
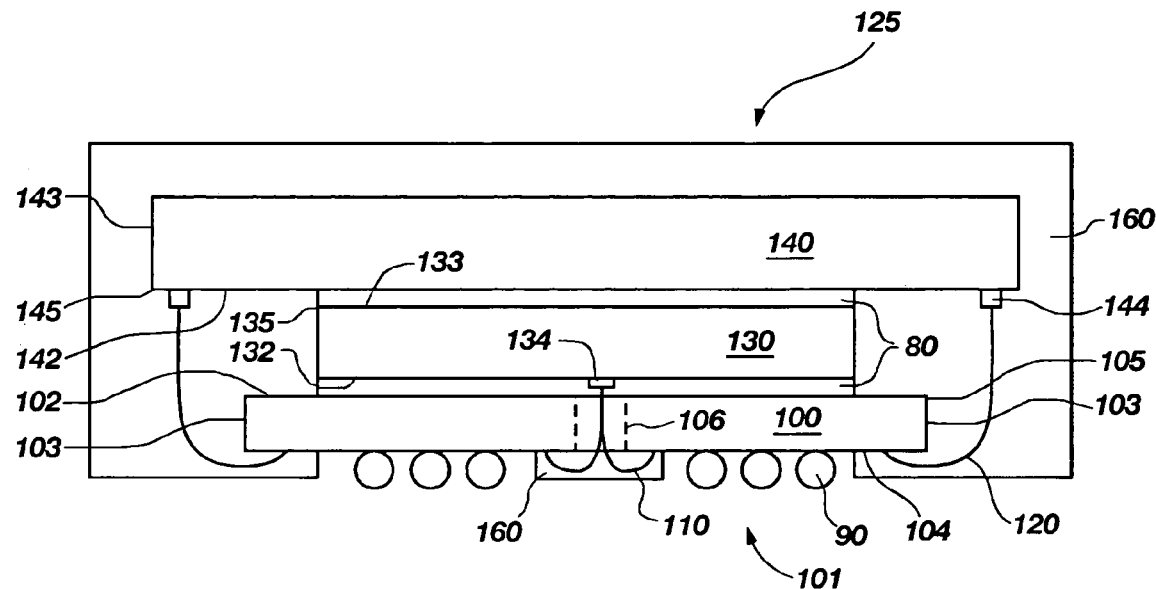
FIGS. 1A through 12B are cross-sectional views of schematic representations of various exemplary embodiments of an assembly of the present invention.

In one exemplary embodiment of the present invention, FIG. 1A shows a cross-sectional view of an exemplary semiconductor device package 125 of the present invention. The semiconductor device package 125 includes a semiconductor device assembly 101. In said assembly 101, a first semiconductor device 130 is attached to the first surface 102 of a substrate 100. The first semiconductor device 130 includes an active surface 132 facing the first surface 102 of the substrate 100. As used herein, the term "semiconductor device" includes, for example, a semiconductor device of silicon, gallium arsenide, indium phosphide or other semiconductive material configured as a processor, logic, memory or other function, wherein integrated circuitry is fabricated on an active surface of the device while part of a wafer or other bulk semiconductor substrate that is later "singulated" to form a plurality of individual semiconductor dice.

Figure 13:
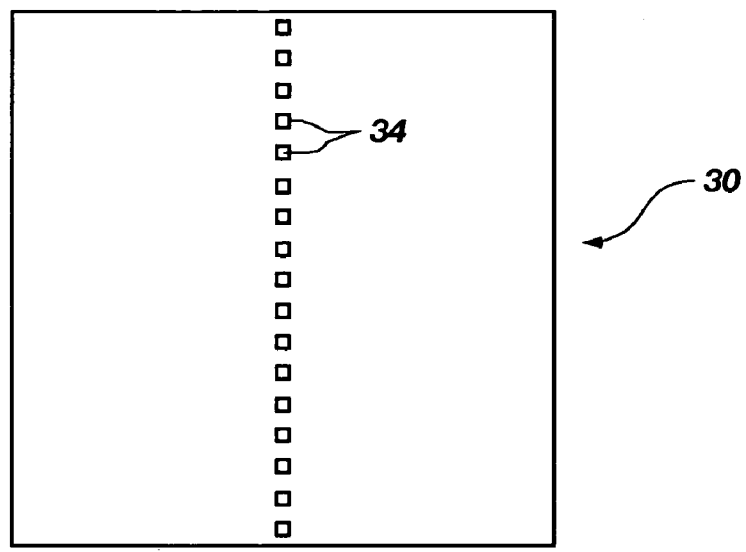
FIGS. 13 and 14 are schematic representations of semiconductor devices of an assembly of the present invention.

The substrate 100 may be any type of substrate or interposer. Any type of substrate, such as a circuit board, a semiconductor device, and the like, in assemblies and assembly methods incorporating teachings of the present invention are within the scope of the present invention. The substrate 100 may be formed from silicon, glass, ceramic, an organic material (e.g., FR-4 or FR-5 resin laminate), metal (e.g., copper, aluminum, etc.), or any other suitable material. The first semiconductor device 130 may include integrated circuitry therein and bond pads 134 (FIGS. 1A and 1B) located substantially centrally in one or more rows on the active surface 132 thereof An exemplary embodiment of a semiconductor device 30 having bond pads 34 located substantially centrally in one row is depicted in FIG. 13.

Returning to FIG. 1A, the first semiconductor device 130 may be attached to the substrate 100 with any suitable die attach material 80, such as a quantity of an appropriate thermoset resin, a quantity of pressure sensitive adhesive, an adhesive-coated film or tape, or any other suitable adhesive. The first semiconductor device 130 may be aligned such that centrally located bond pads 134 are exposed through a central slot 106 of the substrate 100.

Figure 14:
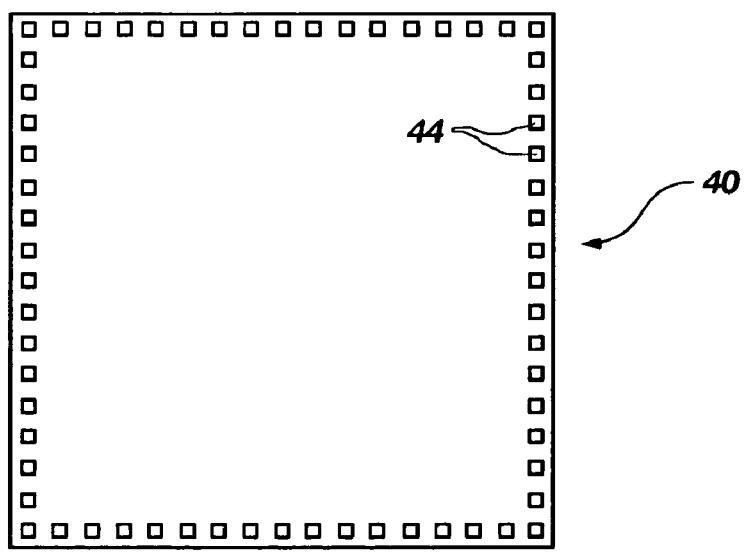

A second semiconductor device 140 with its active surface 142 facing the first semiconductor device 130 is attached to a back side surface 133 of the first semiconductor device 130. The second semiconductor device 140 may be attached using the same or another die attach material 80. The second semiconductor device 140 may include integrated circuitry therein and bond pads 144 located substantially peripherally in one or more rows on the active surface 142 thereof. An exemplary embodiment of a semiconductor device 40 having bond pads 44 located substantially peripherally is depicted in FIG. 14. Returning to FIG. 1A, an outer periphery 145 of the second semiconductor device 140 extends beyond an outer periphery 135 of the first semiconductor device 130. The second semiconductor device 140 may be aligned such that the peripherally located bond pads 144 are exposed, overhanging both the first semiconductor device 130 and the substrate 100.

For example, the second semiconductor device active surface 142 may have a surface area larger than both the surface area of the first semiconductor device back side surface 133 and the surface area of the substrate first surface 102. Therefore, the outer periphery 145 of the second semiconductor device 140 is larger than both the outer periphery 135 of the first semiconductor device 130 and the outer periphery 105 of the substrate 100. A semiconductor device package 125 including a second semiconductor device 140 having four sides 143 adjacent the active surface 142 wherein one, two, three, or four of the four sides 143 overhang both the first semiconductor device 130 and the substrate 100 is within the scope of the present invention.

Discrete conductive elements 110, depicted as bond wires, are formed or placed by a suitable method, such as using a wire bond capillary between bond pads 134 of first semiconductor device 130 and corresponding contact areas of a second surface 104 of the substrate 100. Discrete conductive elements 110 may comprise the illustrated bond wires, tape-automated bond (TAB) elements comprising traces on a flexible dielectric film, other thermocompression bonded leads, or other suitable types of conductive elements. Discrete conductive elements 120 extend from bond pads 144 of the second semiconductor device 140, past outside faces 103 of the substrate 100, to corresponding contact areas of a second surface 104 of substrate 100. The outside faces 103 of the substrate 100 comprise an outer periphery 105 of the substrate 100, and portions of the discrete conductive elements 120 extend beyond the outer periphery of the substrate 100 toward the second semiconductor device bond pads 144. Interconnect bumps 90 are operably coupled to the second surface 104 of the substrate 100, enabling electrical connection to external circuitry (not shown).

Figure 1B:
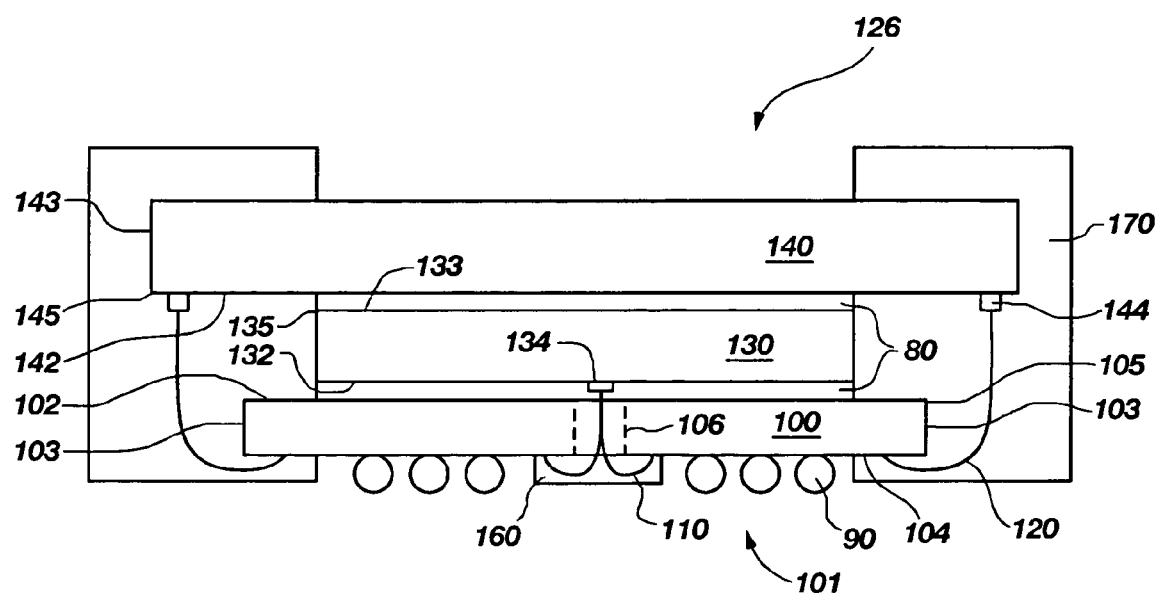

Once bond pads 134, 144 of the semiconductor devices 130, 140 are in communication with their corresponding contact areas of the substrate 100, a protective encapsulant 160 maybe placed over all or part of the semiconductor device assembly 101, including the substrate 100, first semiconductor device 130, and second semiconductor device 140. In particular, vulnerable components in the semiconductor device assembly, such as the bond wires 110, 120 and exposed portions of the active surface 142 of the second semiconductor device 140 are preferably sealed with a protective encapsulant 160. FIG. 1A shows the semiconductor device package 125 including full, over-molded encapsulation, with a protective encapsulant 160 over part of substrate 100, first semiconductor device 130, and second semiconductor device 140. FIG. 1B shows a semiconductor device package 126 having a protective encapsulant 170 over part of the semiconductor device assembly 101, including part of the substrate 100, first semiconductor device 130, and part of second semiconductor device 140. The encapsulation is flanged, and part of the back side of the second semiconductor device 140 is exposed in the semiconductor device package 126 of FIG 1B.

By way of example only, the protective encapsulant 160, 170 may comprise a pot or transfer molded package, as shown in FIGS. 1A and 1B, a stereolithographically fabricated package, a glob top type overcoat, or other suitable packaging. Of course, any suitable materials and processes may be used to form the protective encapsulant 160, 170. In the molded package example, protective encapsulant 160 may be formed from a transfer molding compound (e.g., a two-part silicon particle-filled epoxy) using known transfer molding processes, which may employ thermoset resins or thermoplastic polymers, or pot-molded using a thermosetting resin or an epoxy compound. In the stereolithography example, the protective encapsulant 160, 170 may comprise a plurality of at least partially superimposed, contiguous, mutually adhered material layers. For example, each layer may be formed by selectively curing (e.g., with a UV laser) regions of a layer of photocurable (e.g., UV curable) material, as known in the stereolithography art. When the protective encapsulant 160, 170 is a glob top, suitable glob top materials (e.g., epoxy, silicone, silicone-carbon resin, polyimide, polyurethane, etc.) may be dispensed, as known in the art, to form protective encapsulant 160, 170.

Figure 2A:
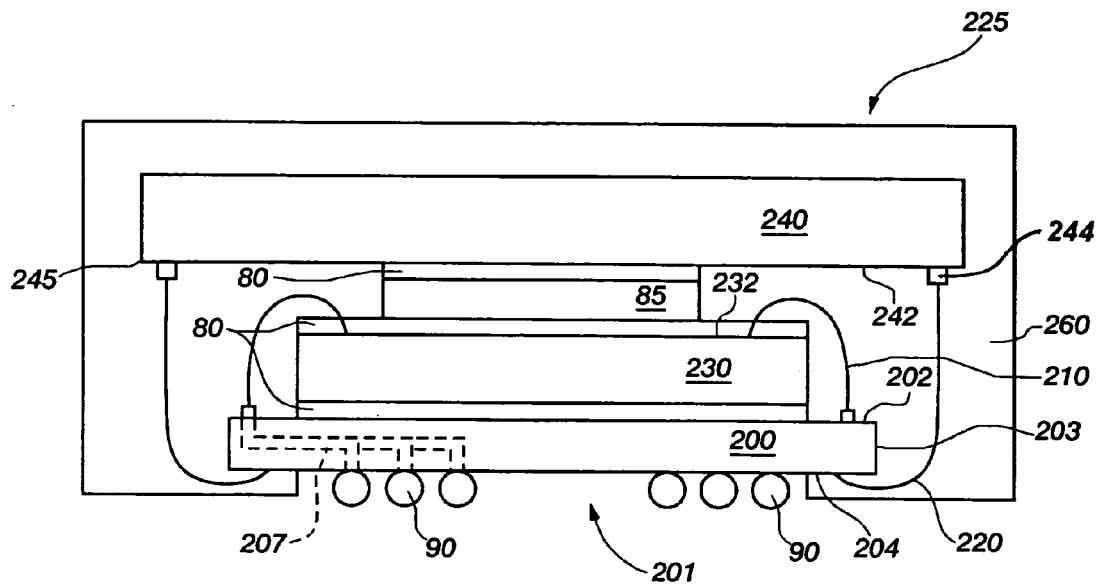

FIG. 2A depicts another embodiment of the present invention. A semiconductor device assembly 201 includes two stacked semiconductor devices. A first semiconductor device 230 is attached to a substrate 200 with its active surface 232 facing away from the substrate 200. A spacer 85 separates the active surface 232 of the first semiconductor device 230 from an active surface 242 of a second semiconductor device 240 stacked thereon. The spacer 85 may comprise any suitable material, such as dielectric-coated silicon (which may be cut from scrapped dice) or polyimide film. The substrate 200, the first semiconductor device 230, the spacer 85, and the second semiconductor device 240 may be attached using a die attach material 80. The second semiconductor device active surface 242 may have an outer periphery 245 larger than an outer periphery of the first semiconductor device 230. The second semiconductor device 240 may be aligned such that bond pads 244, peripherally located thereon, are exposed, overhanging the spacer 85, the first semiconductor device 230, and the substrate 200.

Figure 2B:
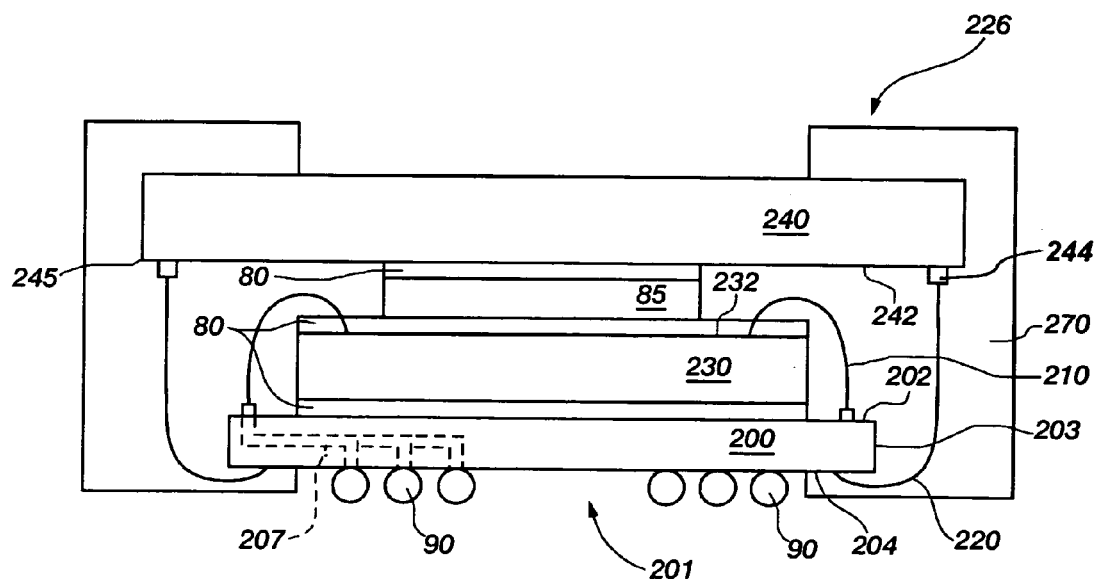

Discrete conductive elements 210 extend from the active surface 232 of the first semiconductor device 230 to a first surface 202 of the substrate 200. As shown in FIGS. 2A and 2B, through-hole vias 207 may conductively connect the first surface 202 of the substrate 200 and a second surface 204 of the substrate 200. The through-hole vias 207 may be operably connected with interconnect bumps 90, enabling electrical connection to external circuitry (not shown). Discrete conductive elements 220 extend from the peripherally located second semiconductor device bond pads 244, past outside faces 203 of the substrate 200, to corresponding contact areas of the second surface 204 of substrate 200. The contact areas may be operably connected with the interconnect bumps 90.

A protective encapsulant 260 may be placed over substantially all of the semiconductor device assembly 201, as shown in FIG. 2A, forming semiconductor package 225. Alternatively, a protective encapsulant 270 may be placed over part of the semiconductor device assembly 201, as shown in FIG. 2B, forming semiconductor package 226.

Figure 3A:
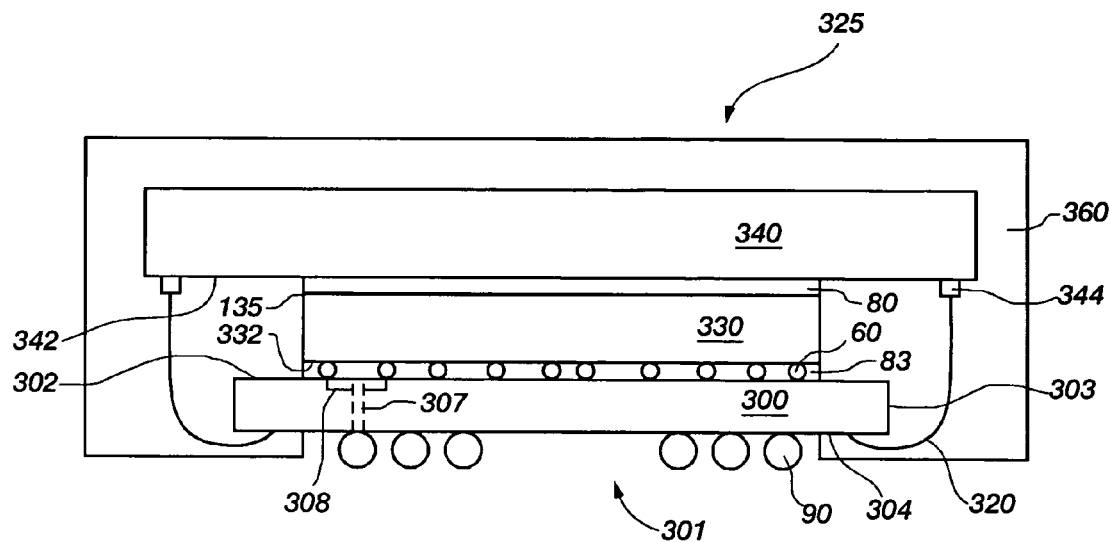
Figure 3B:
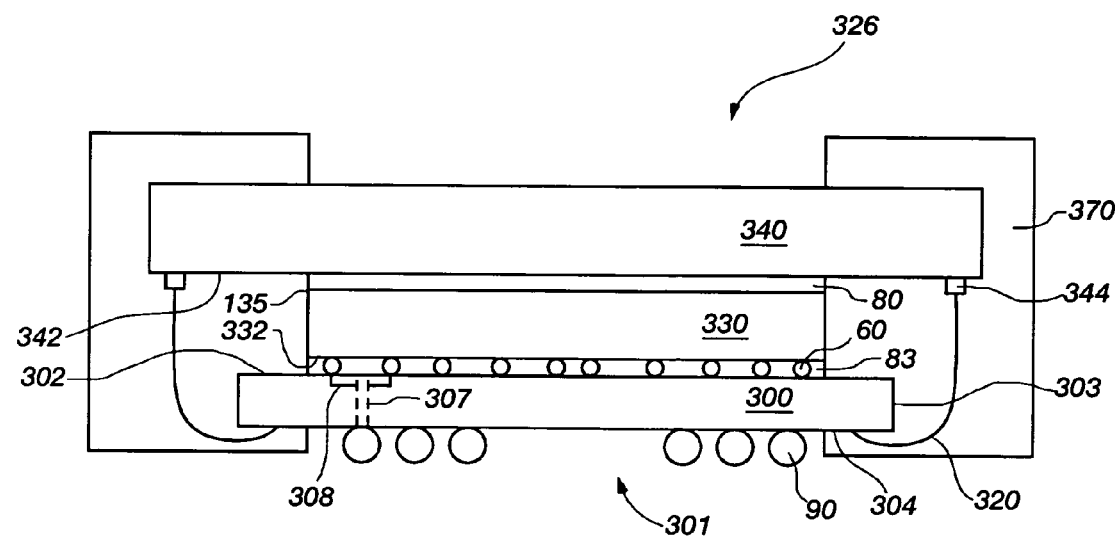

FIGS. 3A and 3B depict additional embodiments of the present invention. A semiconductor device assembly 301 includes two stacked semiconductor devices. A first semiconductor device 330 is attached to a substrate 300 in a flip-chip configuration, with conductive bumps 60 disposed therebetween. The first semiconductor device 330 includes an active surface 332 facing a first surface 302 of the substrate 300. The conductive bumps 60 are preferably shaped as balls, but may be shaped as pillars, columns, and/or studs. The conductive bumps 60 may be formed of any known conductive material or alloy thereof, such as solder, lead, tin, copper, silver and/or gold, as well as of conductive polymers and/or conductive composites. The conductive bumps 60 may include a core having layers thereon utilizing such materials and/or alloys thereof. As such, the conductive bumps 60 act as electrical interconnections between the first semiconductor device 330 and the substrate 300. In addition, the previously set forth interconnect bumps 90 may have the same physical and electrical characteristics as the conductive bumps 60. The conductive bumps 60 may be operably coupled to interconnect bumps 90 through vias 307, and, if desired or required, a redistribution layer (RDL) extending over a surface of the substrate 300 or redistribution traces extending therewithin. The RDL comprises a plurality of conductive traces 308 extending from contact locations on a surface to redistribute the contact locations to another layout.

A dielectric filler material 83 may fill the gap between the substrate 300 and the first semiconductor device 330. The filler material 83 may be applied by employing methods of injecting, dispensing or flowing a filler material 83, or by any other suitable method. For example, such methods may include applying the filler material 83 in the gap between the first semiconductor device 330 and the substrate 300 and allowing the filler material 83 to fill the gap by capillary action and/or pressure flow. Although the filler material 83 is not required, it is preferred so as to protect the conductive bumps 60 from the environment.

A second semiconductor device 340 with its active surface 342 facing the first semiconductor device 330, is attached to a back side surface 333 (not shown) of the first semiconductor device 330 using a die attach material 80. The second semiconductor device 340 may be aligned such that bond pads 344, peripherally located thereon, are exposed, overhanging the first semiconductor device 330, and the substrate 300. Discrete conductive elements 320 extend from the peripherally located second semiconductor device bond pads 344, past outside faces 303 of the substrate 300, to corresponding contact areas of a second surface 304 of substrate 300. The second surface 304 of the substrate 300 opposes the first surface 302 of the substrate 300.

Once the semiconductor devices of such an assembly have been assembled with one another and electrically connected with the substrate or with one another, the assembly may be packaged by encapsulation as known in the art using, for example, transfer molding, injection molding, pot molding or stereolithographic techniques. A protective encapsulant 360 may be placed over substantially all of the semiconductor device assembly 301, as shown in FIG. 3A, forming semiconductor package 325. Alternatively, a protective encapsulant 370 may be placed over part of the semiconductor device assembly 301, as shown in FIG. 3B, forming semiconductor package 326.

Figure 4A:
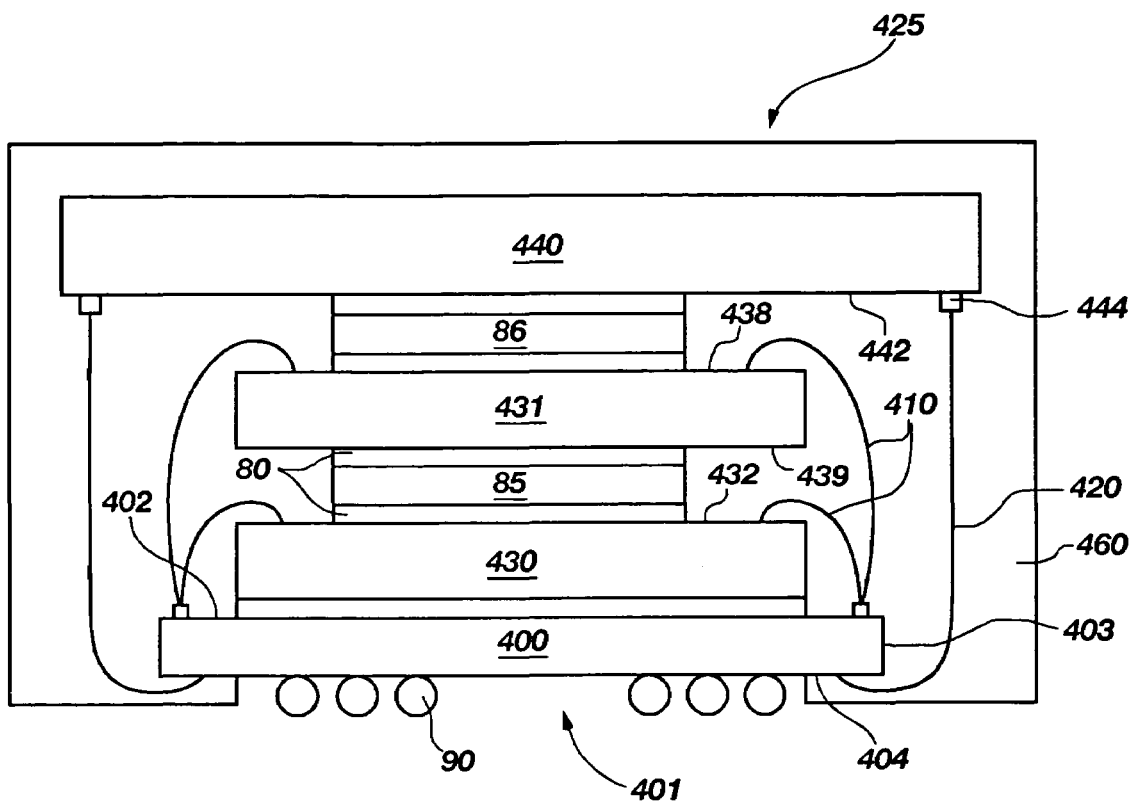
Figure 4B:
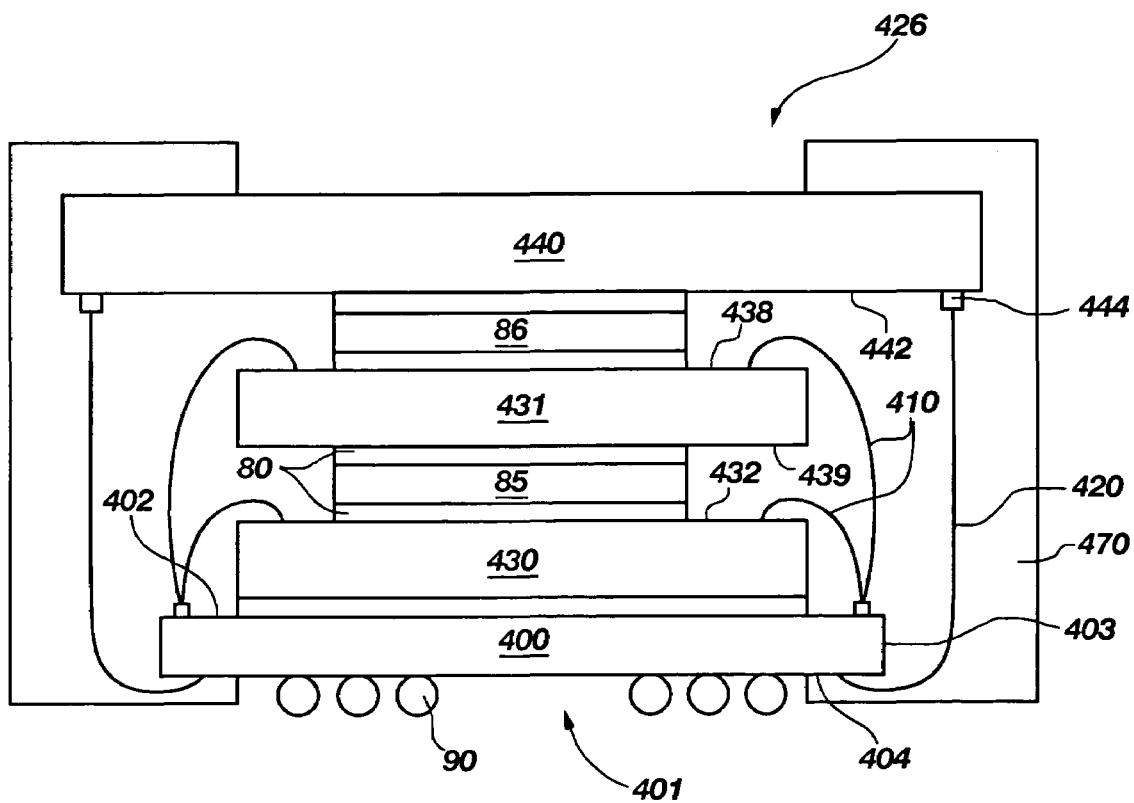

FIGS. 4A and 4B depict additional embodiments of the present invention. A semiconductor device assembly 401 includes three stacked semiconductor devices. A first semiconductor device 430 is attached to a substrate 400 with its active surface 432 facing away from the substrate 400 in a COB configuration. A first spacer 85 separates the active surface 432 of the first semiconductor device 430 from a back side surface 439 of a second, central semiconductor device 431 stacked thereon in a COB configuration. The separation enables discrete conductive elements 410 to extend from the active surface 432 of the first semiconductor device 430 to a first surface 402 of the substrate 400. A second spacer 86 separates an active surface 438 of the second semiconductor device 431 from an active surface 442 of a third semiconductor device 440 stacked thereon. The third semiconductor device 440 may be aligned such that bond pads 444, peripherally located thereon, are exposed, overhanging the first semiconductor device 430, the second semiconductor device 431, and the substrate 400. Discrete conductive elements 420 extend from the peripherally located third semiconductor device bond pads 444, past outside faces 403 of the substrate 400, to corresponding contact areas of a second surface 404 of substrate 400. The second surface 404 of the substrate 400 opposes the first surface 402 of the substrate 400.

A protective encapsulant 460 may be placed over substantially all of the semiconductor device assembly 401, as shown in FIG. 4A, forming semiconductor package 425. Alternatively, a protective encapsulant 470 may be placed over part of the semiconductor device assembly 401, as shown in FIG. 4B, forming semiconductor package 426.

Figure 5A:
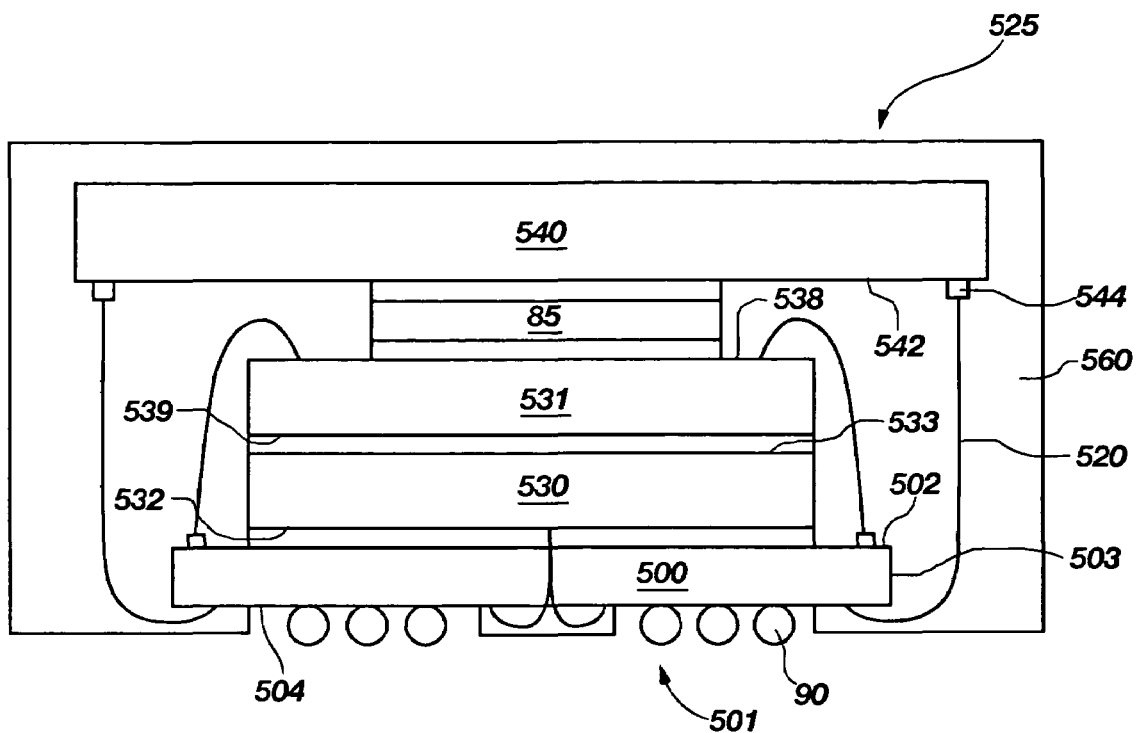
Figure 5B:
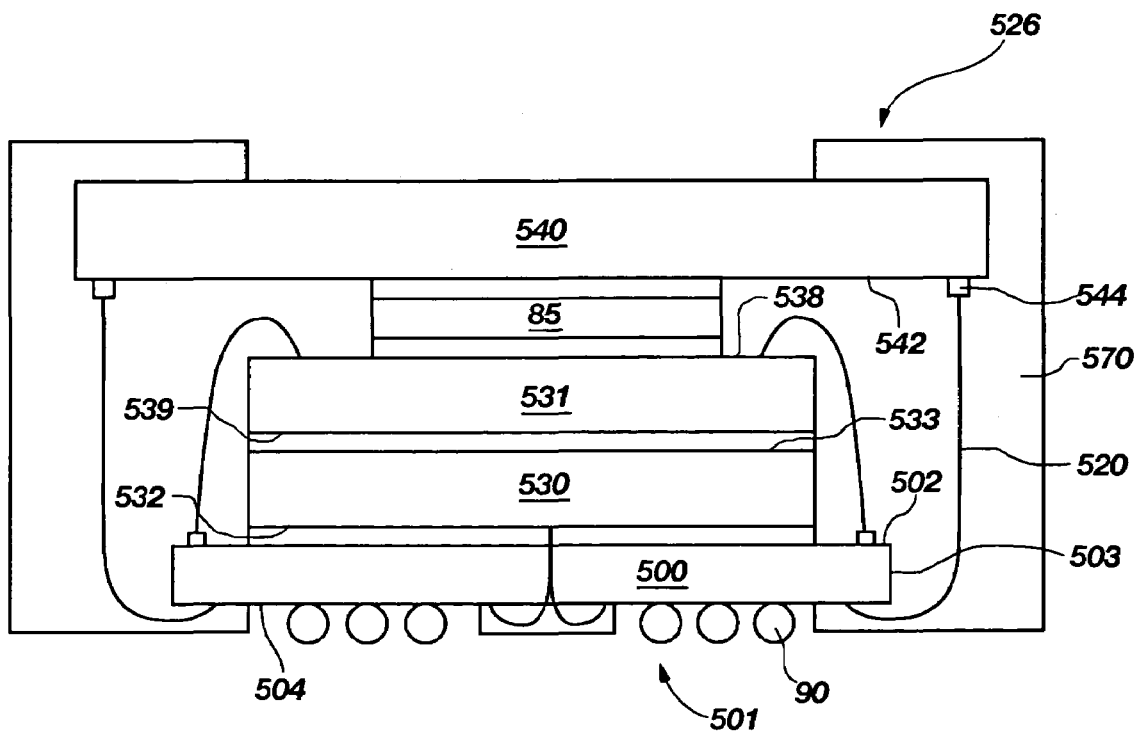

FIGS. 5A and 5B depict additional embodiments of the present invention. A semiconductor device assembly 501 includes three stacked semiconductor devices. A first semiconductor device 530 is attached to a first surface 502 of a substrate 500 in a BOC configuration. The first semiconductor device 530 includes an active surface 532 facing the first surface 502 of the substrate 500. A second semiconductor device 531 is attached to a back side surface 533 of the first semiconductor device 530 in a COB configuration. A back side surface 539 of the second semiconductor device 531 faces the first semiconductor device 530. A spacer 85 on an active surface 538 of the second semiconductor device 531 separates an active surface 542 of a third semiconductor device 540 from the active surface 538 of the second semiconductor device 531.

The third semiconductor device 540 may be aligned such that bond pads 544, peripherally located thereon, are exposed, overhanging the first semiconductor device 530, the second semiconductor device 531, and the substrate 500. Discrete conductive elements 520 extend from the peripherally located third semiconductor device bond pads 544, past outside faces 503 of the substrate 500, to corresponding contact areas of a second surface 504 of substrate 500. The second surface 504 of the substrate 500 opposes the first surface 502 of the substrate 500.

A protective encapsulant 560 maybe placed over substantially all of the semiconductor device assembly 501, as shown in FIG. 5A, forming semiconductor package 525. Alternatively, a protective encapsulant 570 may be placed over part of the semiconductor device assembly 501, as shown in FIG. 5B, forming semiconductor package 526.

Figure 6A:
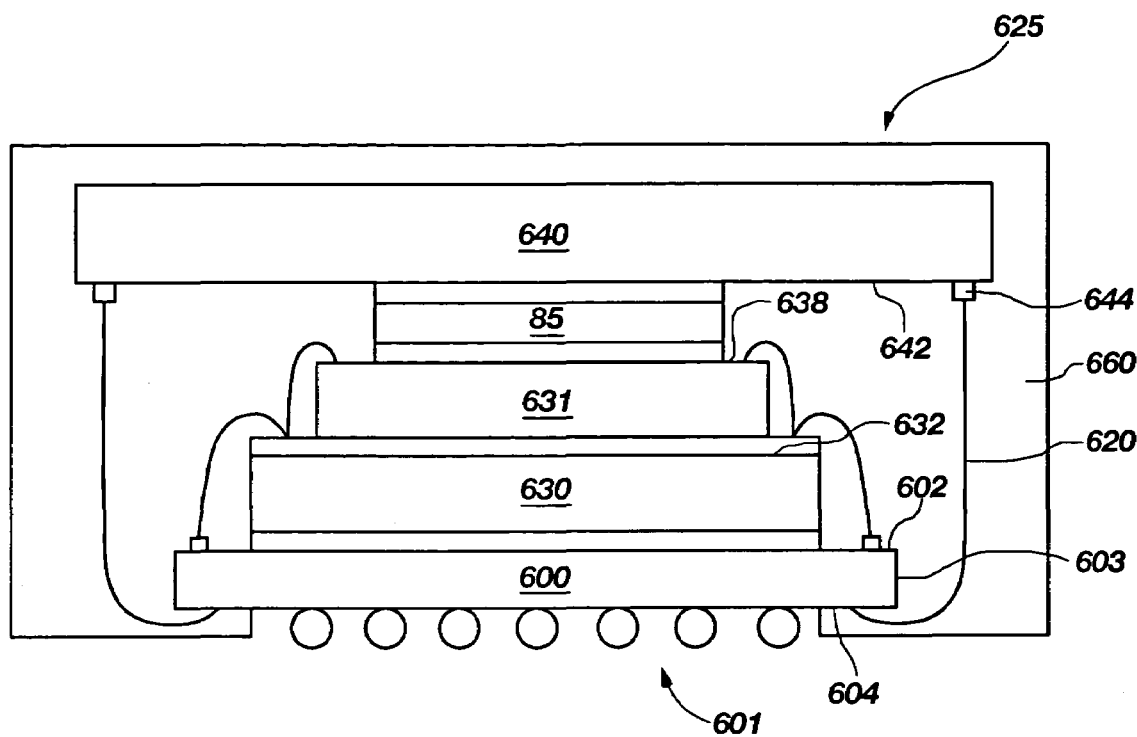
Figure 6B:
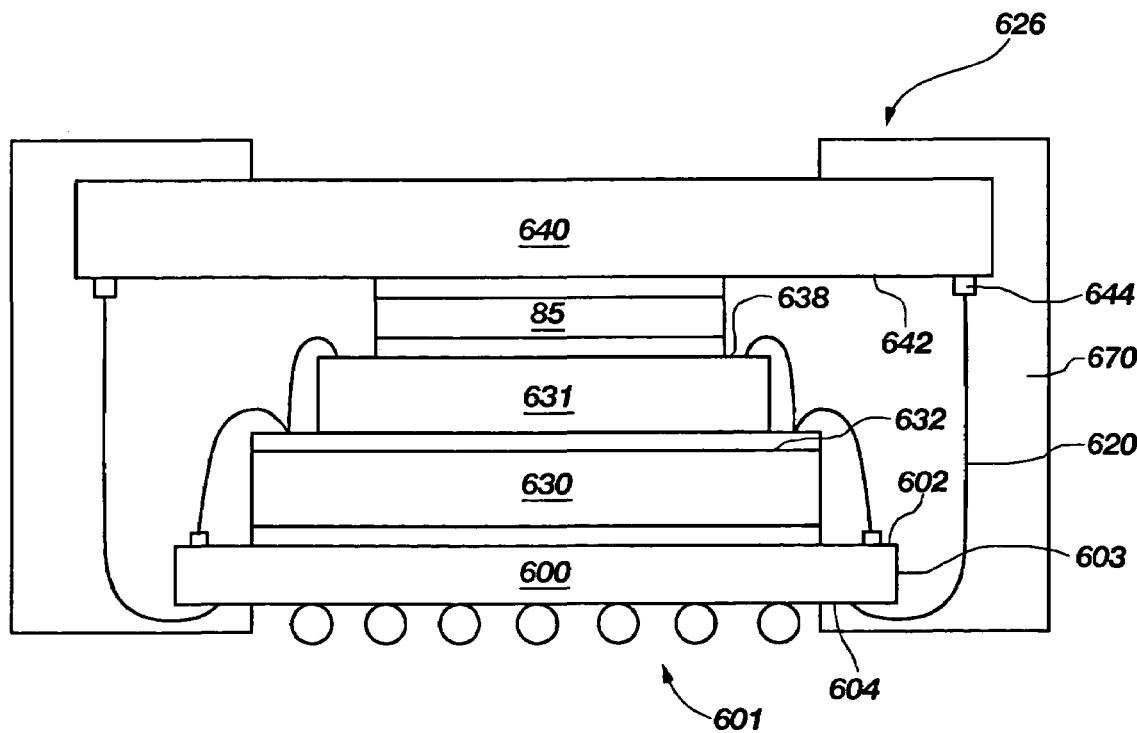

FIGS. 6A and 6B depict additional embodiments of the present invention. A semiconductor device assembly 601 includes three stacked semiconductor devices. A first semiconductor device 630 is attached to a first surface 602 of a substrate 600 with an active surface 632 of the first semiconductor device 630 facing away from the substrate 600. A second semiconductor device 631 is attached in flip-chip configuration to the active surface 632 of the first semiconductor device 630. An active surface 638 of the second semiconductor device 631 faces away from the first semiconductor device 630. A spacer 85 is positioned on the active surface 638 of the second semiconductor device 631, separating an active surface 642 of a third semiconductor device 640 from the active surface 638 of the second semiconductor device 631.

The third semiconductor device 640 may be aligned such that bond pads 644, peripherally located thereon, are exposed, overhanging the first semiconductor device 630, the second semiconductor device 631, and the substrate 600. Discrete conductive elements 620 extend from the peripherally located third semiconductor device bond pads 644, past outside faces 603 of the substrate 600, to corresponding contact areas of a second surface 604 of substrate 600. The second surface 604 of the substrate 600 opposes the first surface 602 of the substrate 600.

A protective encapsulant 660 may be placed over substantially all of the semiconductor device assembly 601, as shown in FIG. 6A, forming semiconductor package 625. Alternatively, a protective encapsulant 670 may be placed over part of the semiconductor device assembly 601, as shown in FIG. 6B, forming semiconductor package 626.

Figure 7A:
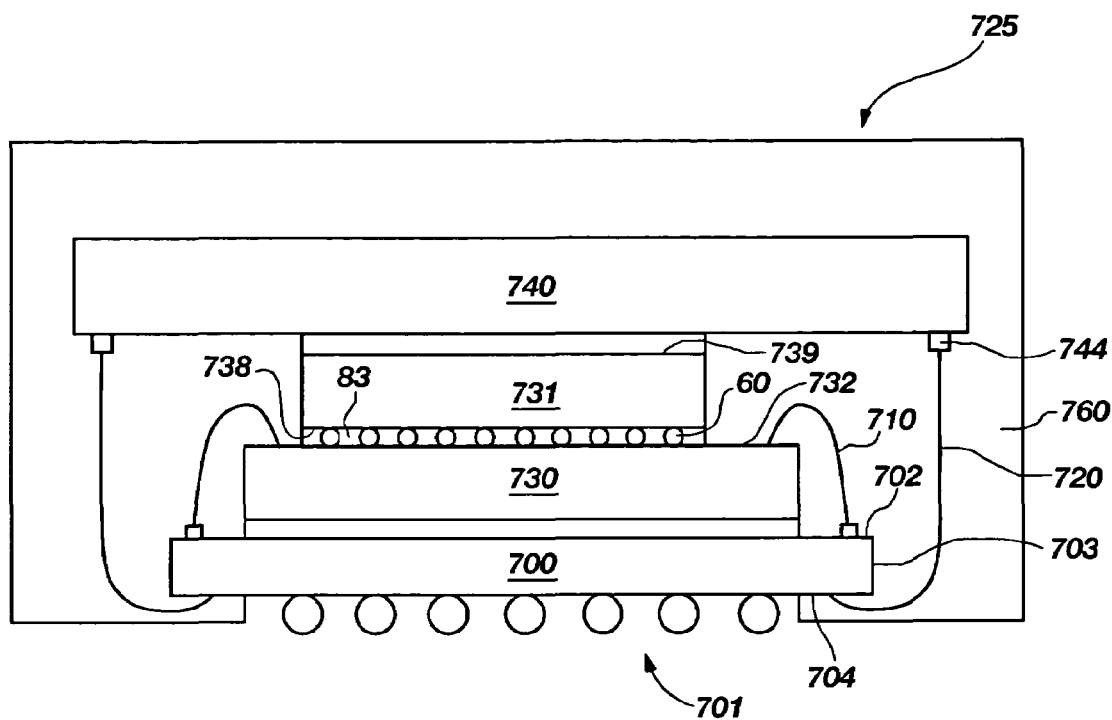
Figure 7B:
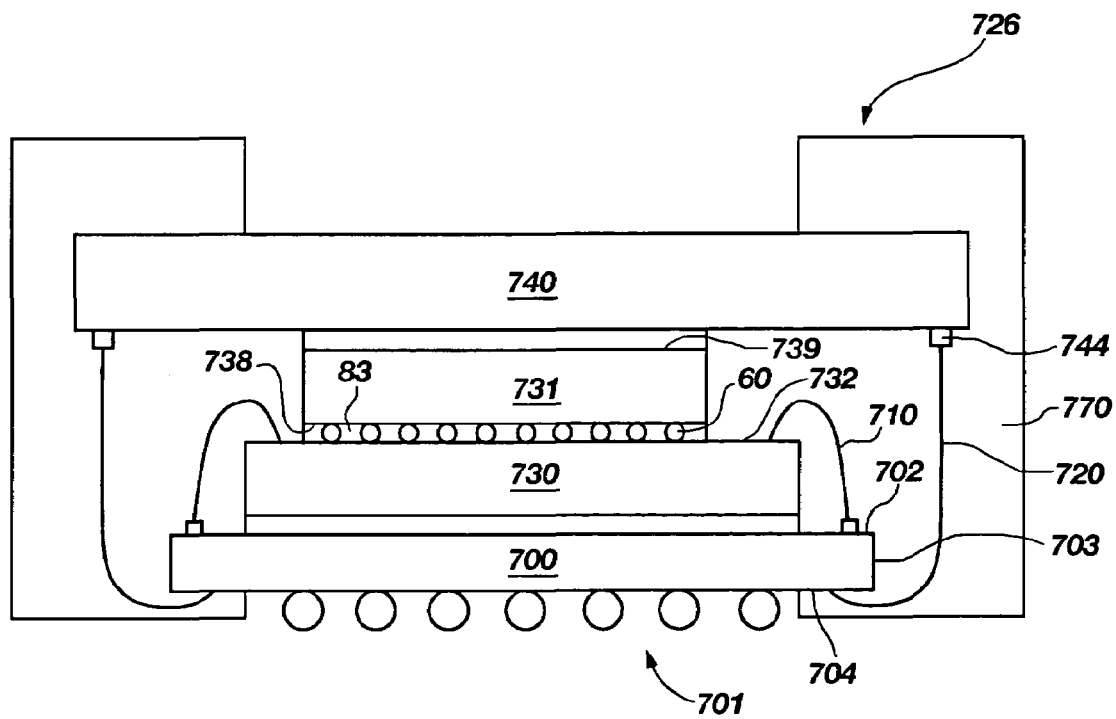

FIGS. 7A and 7B depict additional embodiments of the present invention. A semiconductor device assembly 701 includes three stacked semiconductor devices. A first semiconductor device 730 is attached to a first surface 702 of a substrate 700 with an active surface 732 of the first semiconductor device 730 facing away from the substrate 700. A second semiconductor device 731 is attached to the active surface 732 of the first semiconductor device 730 in flip-chip configuration. An active surface 738 of the second semiconductor device 731 faces the first semiconductor device 730 with conductive bumps 60 disposed therebetween. A redistribution layer on the active surface 732 of the first semiconductor device 730 may electrically connect the conductive bumps 60 with discrete conductive elements 710, operably coupling the second semiconductor device 731 and the substrate 700. Additional discrete conductive elements 710 may operably couple the first semiconductor device 730 and the substrate 700.

A third semiconductor device 740 is positioned over a back side surface 739 of the second semiconductor device 731. The third semiconductor device 740 may be aligned such that bond pads 744, peripherally located thereon, are exposed, overhanging the first semiconductor device 730, the second semiconductor device 731, and the substrate 700. Discrete conductive elements 720 extend from the peripherally located third semiconductor device bond pads 744, past outside faces 703 of the substrate 700, to corresponding contact areas of a second surface 704 of substrate 700. The second surface 704 of the substrate 700 opposes the first surface 702 of the substrate 700.

A protective encapsulant 760 may be placed over substantially all of the semiconductor device assembly 701, as shown in FIG. 7A, forming semiconductor package 725. Alternatively, a protective encapsulant 770 may be placed over part of the semiconductor device assembly 701, as shown in FIG. 7B, forming semiconductor package 726.

Figures 8A, 8B:
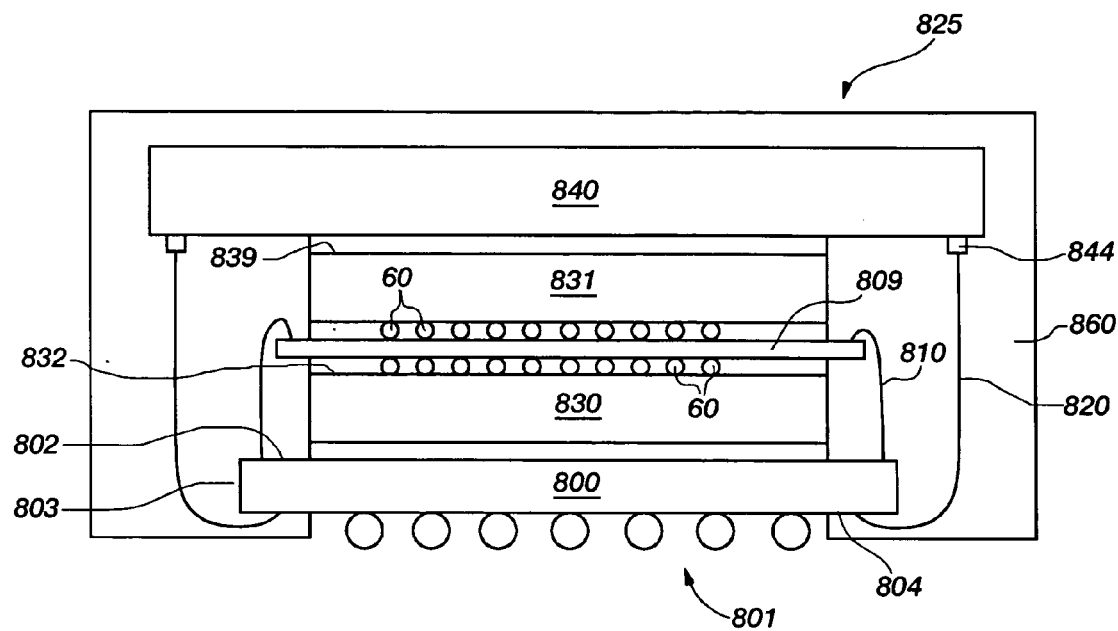

FIGS. 8A and 8B depict additional embodiments of the present invention. A semiconductor device assembly 801 includes three stacked semiconductor devices. A first semiconductor device 830 is attached to a first surface 802 of a first substrate 800 with an active surface 832 of the first semiconductor device 830 facing away from the first substrate 800. A second substrate 809 is positioned over the first semiconductor device 830 in a flip-chip configuration with conductive bumps 60 disposed therebetween. The second substrate 809 may comprise any suitable substrate, interposer, or conductive traces on a dielectric film. Discrete conductive elements 810 may provide electrical connection between the second substrate 809 and the first substrate 800. A second semiconductor device 831 is attached to the second substrate 809. An active surface of the second semiconductor device 831 faces the second substrate 809 in flip-chip configuration with additional conductive bumps 60 disposed therebetween.

A third semiconductor device 840 is positioned over a back side surface 839 of the second semiconductor device 831. The third semiconductor device 840 may be aligned such that bond pads 844, peripherally located thereon, are exposed, overhanging the first semiconductor device 830, the second semiconductor device 831, the second substrate 809, and the first substrate 800. Discrete conductive elements 820 extend from the peripherally located second semiconductor device bond pads 844, past outside faces 803 of the first substrate 800, to corresponding contact areas of a second surface 804 of substrate 800. The second surface 804 of the substrate 800 opposes the first surface 802 of the substrate 800.

A protective encapsulant 860 may be placed over substantially all of the semiconductor device assembly 801, as shown in FIG. 8A, forming semiconductor package 825. Alternatively, a protective encapsulant 870 may be placed over part of the semiconductor device assembly 801, as shown in FIG. 8B, forming semiconductor package 826.

Figure 9A:
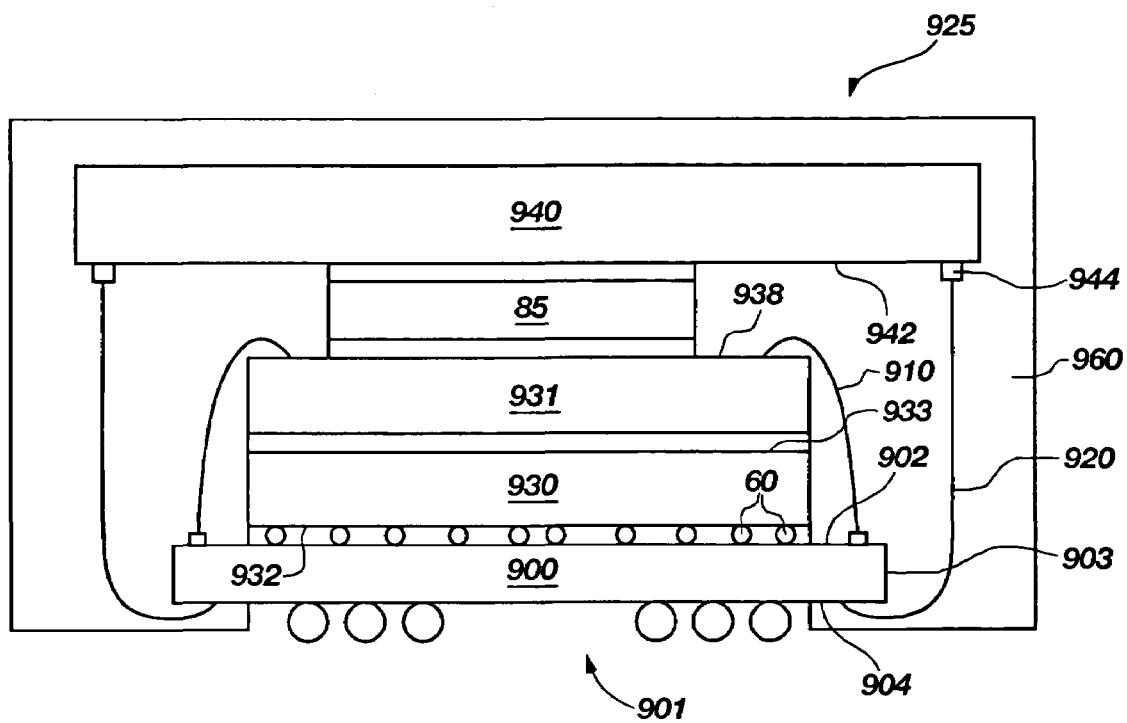
Figure 9B:
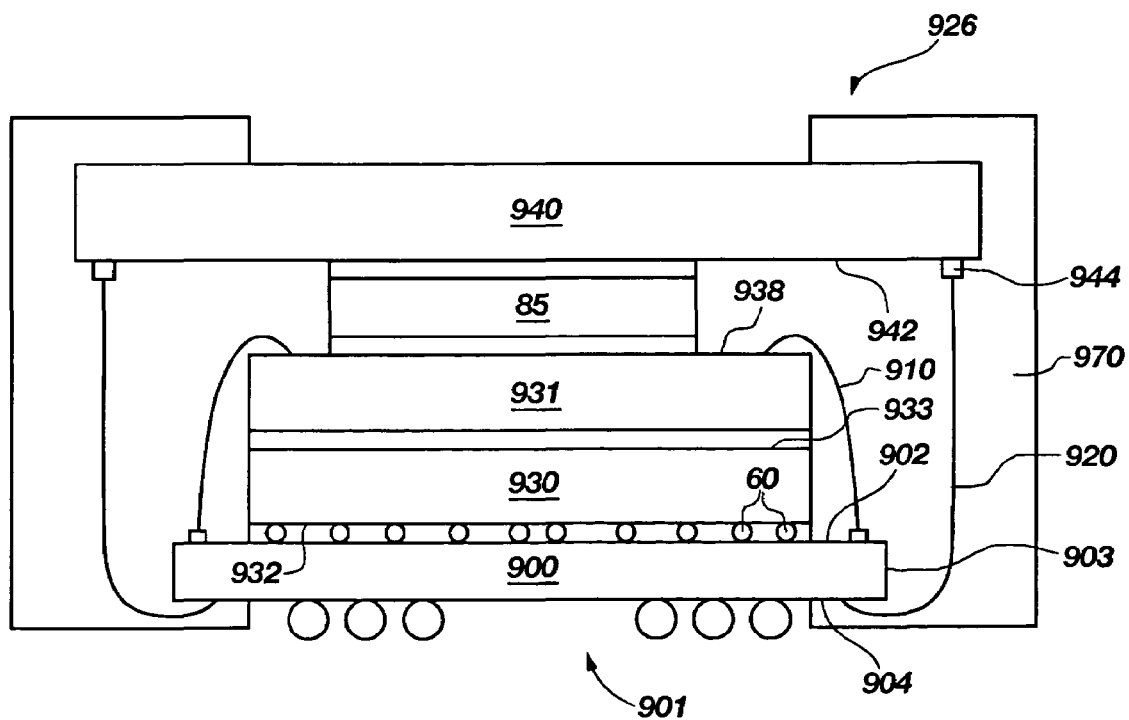

FIGS. 9A and 9B depict additional embodiments of the present invention. A semiconductor device assembly 901 includes three stacked semiconductor devices. A first semiconductor device 930 is attached to a first surface 902 of a substrate 900 in flip-chip configuration. An active surface 932 of the first semiconductor device 930 faces the substrate 900 with conductive bumps 60 disposed therebetween. A second semiconductor device 931 is attached to a back side surface 933 of the first semiconductor device 930. An active surface 938 of the second semiconductor device 931 faces away from the substrate 900, and a spacer 85 positioned on the active surface 938 separates the active surface 938 from the active surface 942 of a third semiconductor device 940. Discrete conductive elements 910 provide electrical connection between the second semiconductor device 931 and the substrate 900.

The third semiconductor device 940 may be aligned such that bond pads 944, peripherally located thereon, are exposed, overhanging the first semiconductor device 930, the second semiconductor device 931, and the substrate 900. Discrete conductive elements 920 extend from the peripherally located third semiconductor device bond pads 944, past outside faces 903 of the substrate 900, to corresponding contact areas of a second surface 904 of substrate 900. The second surface 904 of the substrate 900 opposes the first surface 902 of the substrate 900.

A protective encapsulant 960 may be placed over substantially all of the semiconductor device assembly 901, as shown in FIG. 9A, forming semiconductor package 925. Alternatively, a protective encapsulant 970 may be placed over part of the semiconductor device assembly 901, as shown in FIG. 9B, forming semiconductor package 926.

Figure 10A:
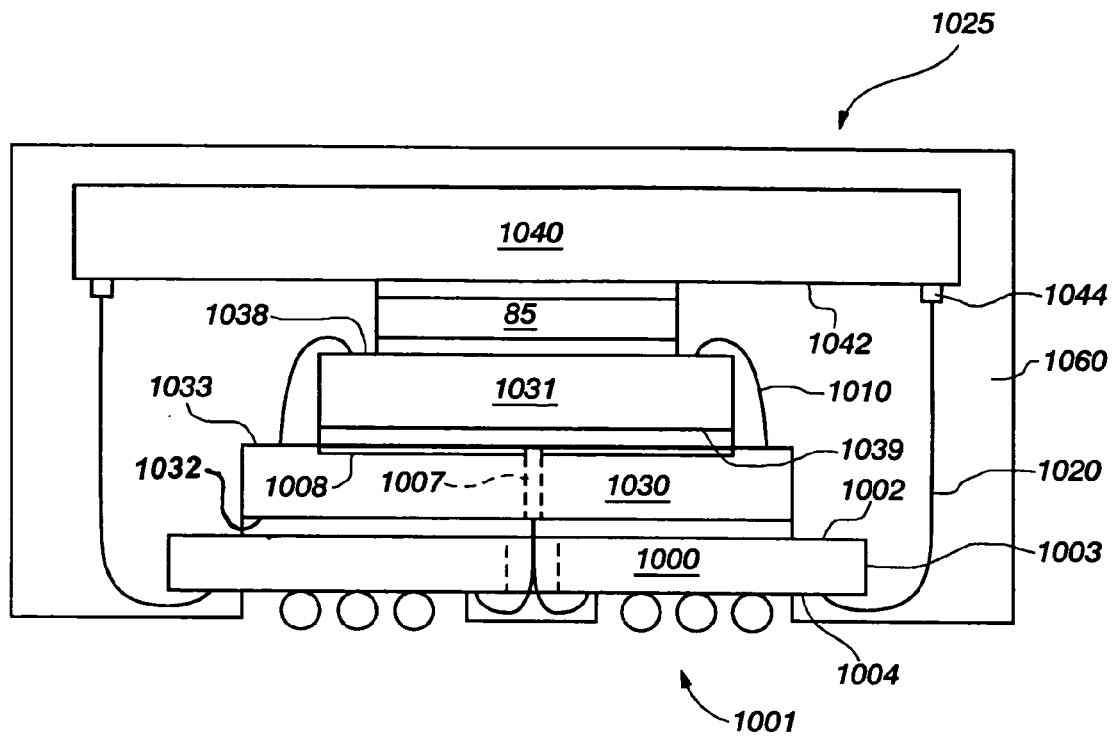
Figure 10B:
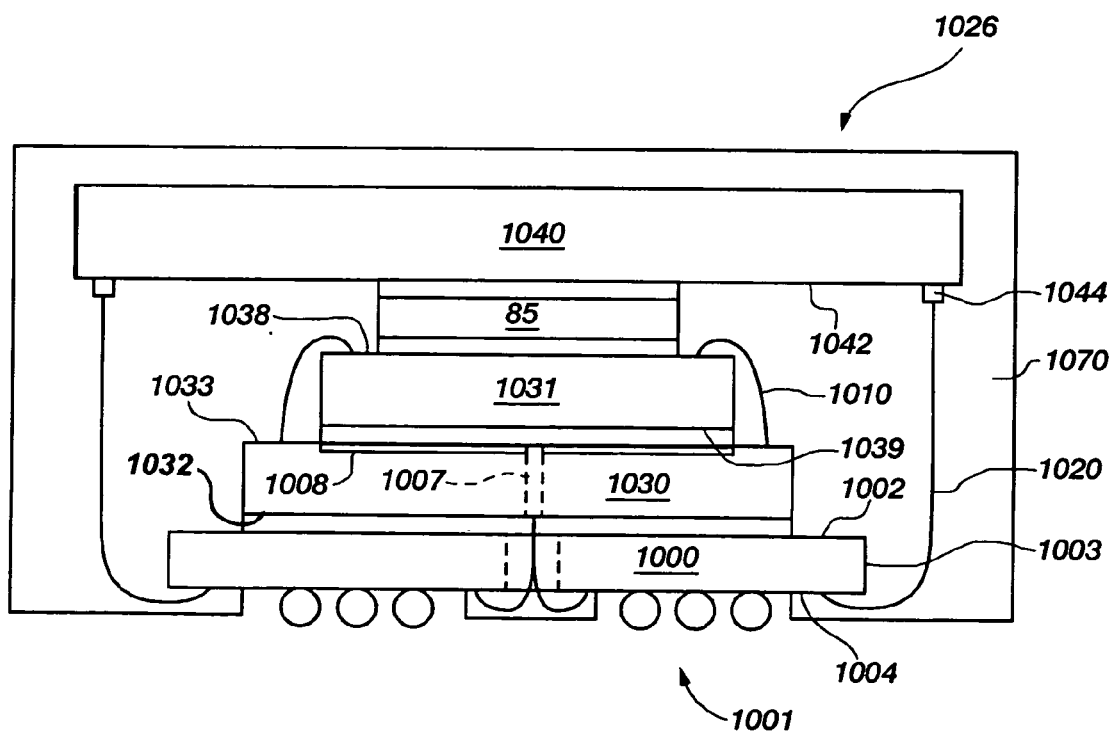

FIGS. 10A and 10B depict additional embodiments of the present invention. A semiconductor device assembly 1001 includes three stacked semiconductor devices. A first semiconductor device 1030 is attached to a first surface 1002 of a substrate 1000 with an active surface 1032 of the first semiconductor device 1030 facing the substrate 1000 in a BOC configuration. A second semiconductor device 1031 is attached to the first semiconductor device 1030. A back surface 1039 of the second semiconductor device 1031 faces a back surface 1033 of the first semiconductor device 1030. A spacer 85 separates an active surface 1038 of the second semiconductor device 1031 from an active surface 1042 of a third semiconductor device 1040, positioned thereon. Discrete conductive elements 1010 connect the active surface 1038 of the second semiconductor device 1031 and the back surface 1033 of the first semiconductor device 1030. A RDL 1008 on the back surface 1033 of the first semiconductor device 1030 and through-hole vias 1007 within the first semiconductor device 1030 may be used to provide electrical communication with the active surface 1032 of the first semiconductor device 1030.

The third semiconductor device 1040 may be aligned such that bond pads 1044, peripherally located thereon, are exposed, overhanging the first semiconductor device 1030, the second semiconductor device 1031, and the substrate 1000. Discrete conductive elements 1020 extend from the peripherally located third semiconductor device bond pads 1044, past outside faces 1003 of the substrate 1000, to corresponding contact areas of a second surface 1004 of substrate 1000. The second surface 1004 of the substrate 1000 opposes the first surface 1002 of the substrate 1000.

A protective encapsulant 1060 may be placed over substantially all of the semiconductor device assembly 1001, as shown in FIG. 10A, forming semiconductor package 1025. Alternatively, a protective encapsulant 1070 may be placed over part of the semiconductor device assembly 1001, as shown in FIG. 10B, forming semiconductor package 1026.

Figure 11A:
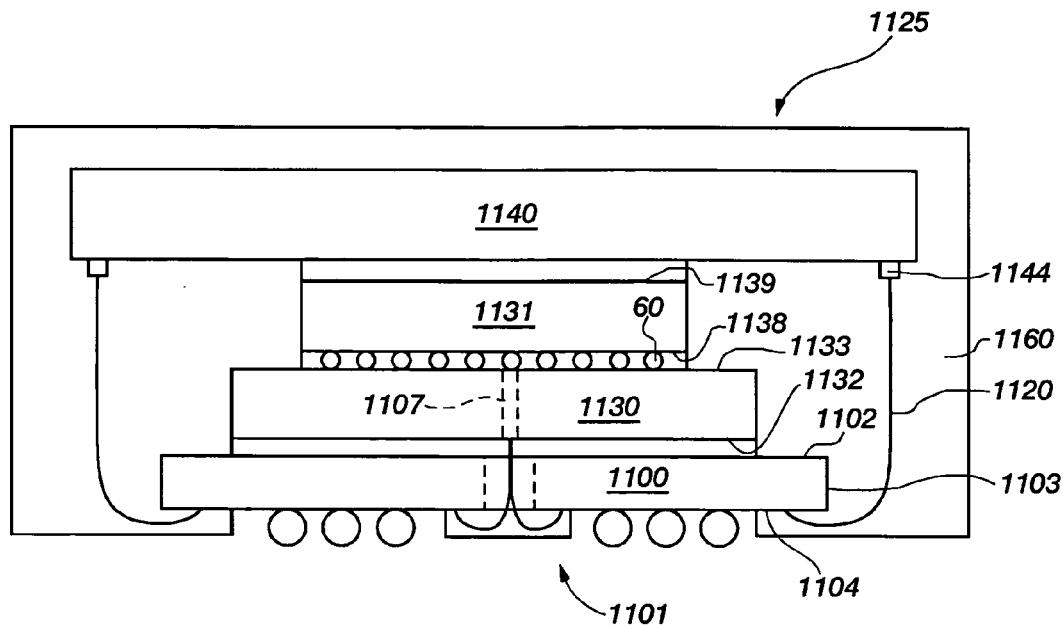
Figure 11B:
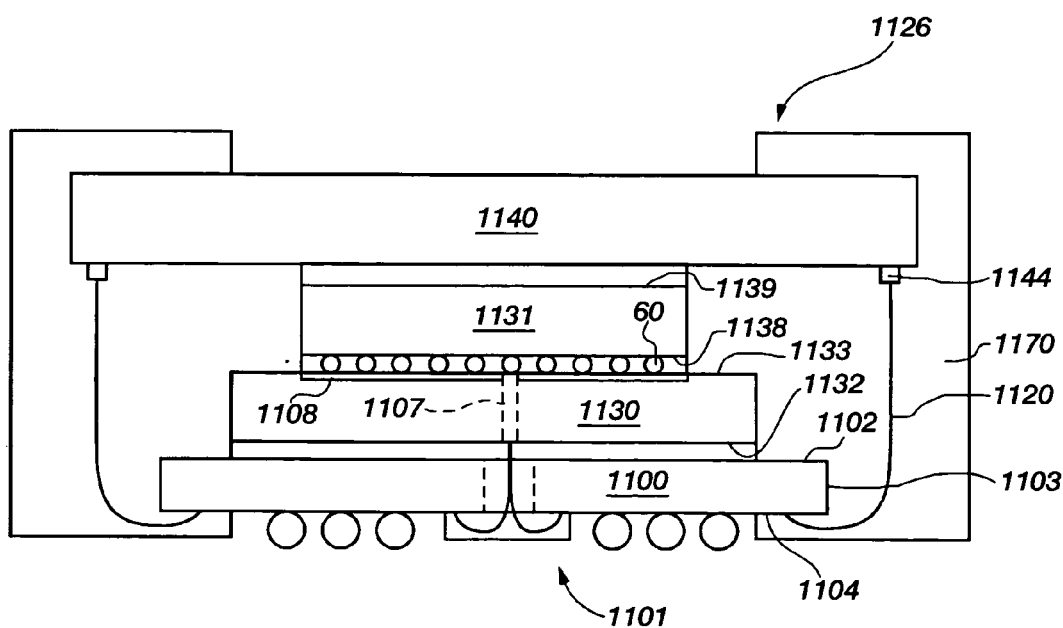

FIGS. 11A and 11B depict additional embodiments of the present invention. A semiconductor device assembly 1101 includes three stacked semiconductor devices. A first semiconductor device 1130 is attached to a first surface 1102 of a substrate 1100 with an active surface 1132 of the first semiconductor device 1130 facing the substrate 1100 in a BOC configuration. A second semiconductor device 1131 is attached to the first semiconductor device 1130 in flip-chip configuration. An active surface 1138 of the second semiconductor device 1131 faces a back surface 1133 of the first semiconductor device 1130 with conductive bumps 60 disposed therebetween. A RDL 1108 on the back surface 1133 of the first semiconductor device 1130 and through-hole vias 1107 within the first semiconductor device 1130 provide electrical communication with the active surface 1132 of the first semiconductor device 1130.

A third semiconductor device 1140 is positioned over a back side surface 1139 of the second semiconductor device 1131. The third semiconductor device 1140 may be aligned such that bond pads 1144, peripherally located on an active surface 1142 thereof, are exposed, overhanging the first semiconductor device 1130, the second semiconductor device 1131, and the substrate 1100. Discrete conductive elements 1120 extend from the peripherally located third semiconductor device bond pads 1144, past outside faces 1103 of the substrate 1100, to corresponding contact areas of a second surface 1104 of substrate 1100. The second surface 1104 of the substrate 1100 opposes the first surface 1102 of the substrate 1100.

A protective encapsulant 1160 may be placed over substantially all of the semiconductor device assembly 1101, as shown in FIG. 11A, forming semiconductor package 1125. Alternatively, a protective encapsulant 1170 may be placed over part of the semiconductor device assembly 1101, as shown in FIG. 11B, forming semiconductor package 1126.

Figure 12A:
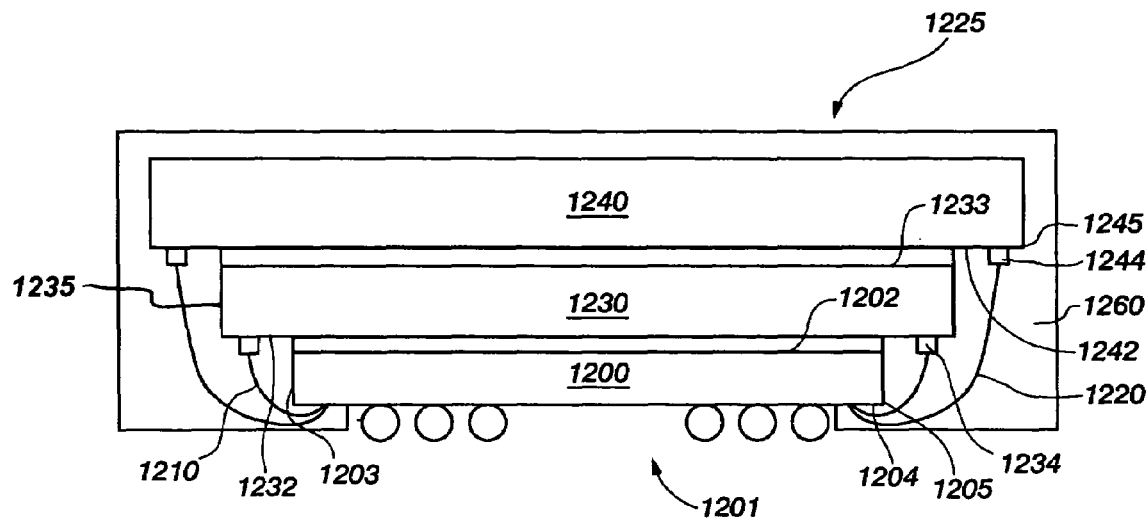
Figure 12B:
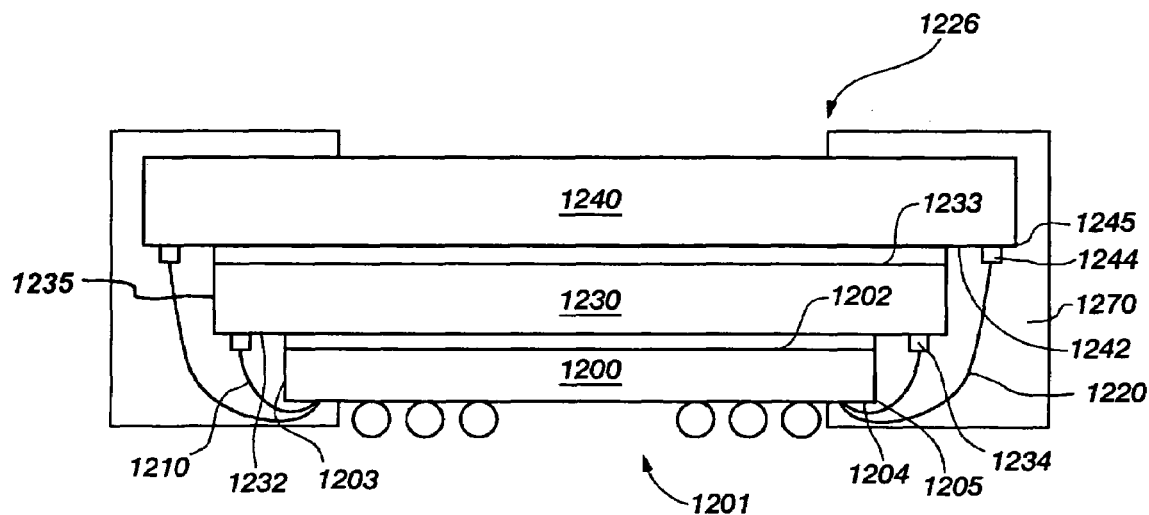

FIGS. 12A and 12B depict additional embodiments of the present invention. A semiconductor device assembly 1201 includes two stacked semiconductor devices. A first semiconductor device 1230 is attached to a first surface 1202 of a substrate 1200 with an active surface 1232 of the first semiconductor device 1230 facing the substrate 1200. An outer periphery 1235 of the first semiconductor device 1230 is larger than an outer periphery 1205 of the substrate 1200. Bond pads 1234, peripherally located on the first semiconductor device active surface 1232 overhang the substrate 1200. Discrete conductive elements 1210 connect the first semiconductor device bond pads 1234 with a second surface 1204 of the substrate 1200. The second surface 1204 of the substrate 1200 opposes the first surface 1202 of the substrate 1200.

A second semiconductor device 1240 is positioned over the first semiconductor device 1230. An active surface 1242 of the second semiconductor device 1240 faces a back surface 1233 of the first semiconductor device 1230. The second semiconductor device active surface 1242 has an outer periphery 1245 greater than the first semiconductor device outer periphery 1235 or the substrate outer periphery 1205. The second semiconductor device 1240 may be aligned such that bond pads 1244, peripherally located thereon, are exposed, overhanging the first semiconductor device 1230 and the substrate 1200. Discrete conductive elements 1220 extend from the peripherally located second semiconductor device bond pads 1244, past outside faces 1203 of the substrate 1200, to corresponding contact areas of the second surface 1204 of substrate 1200.

A protective encapsulant 1260 may be placed over substantially all of the semiconductor device assembly 1201, as shown in FIG. 12A, forming semiconductor package 1225. Alternatively, a protective encapsulant 1270 may be placed over part of the semiconductor device assembly 1201, as shown in FIG. 12B, forming semiconductor package 1226.

Figure 15:
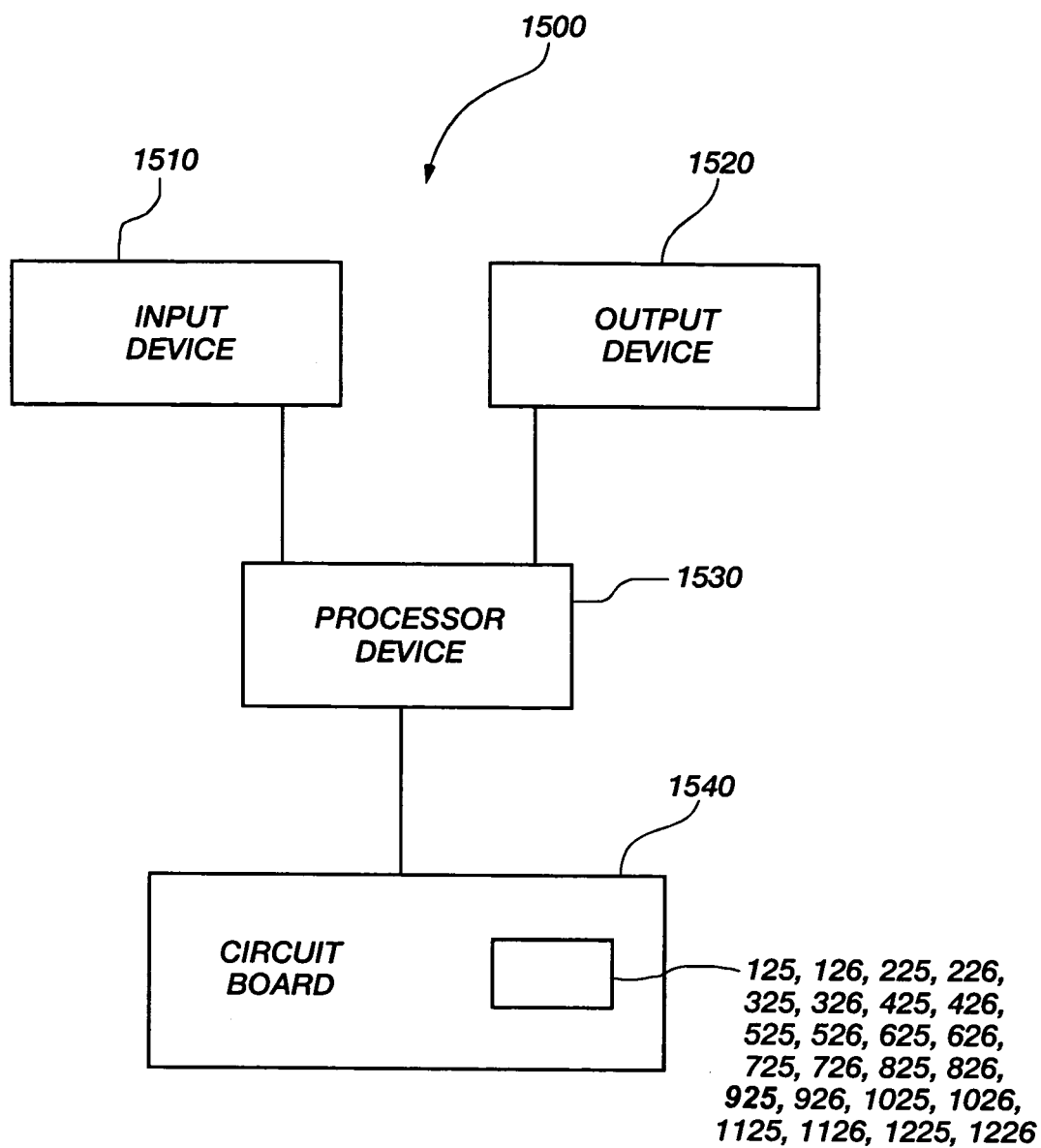
FIG. 15 is a block diagram of an electronic system, in accordance with an embodiment of the present invention.

FIG. 15 is a block diagram of an electronic system, in accordance with an embodiment of the present invention. The electronic system 1500 includes an input device 1510, an output device 1520, and a circuit board 1540, all coupled to a processor device 1530. The circuit board 1540 includes at least one semiconductor package 125, 126, 225, 226, 325, 326, 425, 426, 525, 526, 625, 626, 725 726, 825, 826, 925, 926, 1025, 1026, 1125, 1126, 1225, 1226 of one or more of the preceding embodiments of the present invention mounted thereto.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor device assembly comprising:
 a substrate having a first surface, a second, opposing surface, and at least one side surface adjacent to the first surface and the second, opposing surface;
 a first semiconductor device disposed on the first surface of the substrate;
 a first plurality of discrete conductive elements operably coupled to the first semiconductor device and the substrate;
 a second semiconductor device disposed over the first semiconductor device, the second semiconductor device having an active surface facing the first semiconductor device; and
 a second plurality of discrete conductive elements operably coupled to the second semiconductor device active surface and the substrate second, opposing surface, at least a portion of some of the second plurality of discrete conductive elements extending beyond the at least one side surface of the substrate.

2. The semiconductor device assembly of claim 1, wherein the second semiconductor device active surface has a surface area larger than a surface area of an active surface of the first semiconductor device.

3. The semiconductor device assembly of claim 2, wherein the surface area of the second semiconductor device active surface is larger than a surface area of the first surface of the substrate.

4. The semiconductor device assembly of claim 1, wherein the second semiconductor device active surface has a perimeter longer than a perimeter of an active surface of the first semiconductor device.

5. The semiconductor device assembly of claim 4, wherein the perimeter of the second semiconductor device active surface is longer than a perimeter of the first surface of the substrate.

6. The semiconductor device assembly of claim 1, wherein the second plurality of discrete conductive elements comprises bond wires.

7. The semiconductor device assembly of claim 1, wherein the second semiconductor device includes bond pads peripherally located on the active surface thereof.

8. The semiconductor device assembly of claim 1, wherein the first semiconductor device includes an active surface facing the substrate first surface.

9. The semiconductor device assembly of claim 8, wherein the first semiconductor device includes bond pads centrally located on the active surface thereof.

10. The semiconductor device assembly of claim 9, wherein the first plurality of discrete conductive elements comprise bond wires extending through a slot in the substrate.

11. The semiconductor device assembly of claim 8, wherein the first plurality of discrete conductive elements comprise conductive bumps.

12. The semiconductor device assembly of claim 8, wherein the first plurality of discrete conductive elements comprise bond wires extending from a plurality of peripherally located bond pads of the first semiconductor device.

13. The semiconductor device assembly of claim 12, wherein the first semiconductor device active surface has a surface area larger than a surface area of the first surface of the substrate.

14. The semiconductor device assembly of claim 12, wherein at least a portion of some of the first plurality of discrete conductive elements extend beyond the at least one side surface of the substrate.

15. The semiconductor device assembly of claim 1, wherein the first semiconductor device includes a back side surface facing the substrate first surface.

16. The semiconductor device assembly of claim 15, further comprising a spacer positioned between the first semiconductor device and the second semiconductor device.

17. The semiconductor device assembly of claim 1, further comprising an encapsulant surrounding at least a portion of the second semiconductor device, and substantially entirely surrounding the first semiconductor device and the second plurality of discrete conductive elements.

18. The semiconductor device assembly of claim 1, further comprising an encapsulant surrounding substantially entirely the first semiconductor device, the second semiconductor device, and the second plurality of discrete conductive elements.

19. The semiconductor device assembly of claim 1, further comprising at least one central semiconductor device, positioned between the first semiconductor device and the second semiconductor device.

20. The semiconductor device assembly of claim 19, further comprising at least one spacer positioned between the at least one central semiconductor device and the second semiconductor device.

21. The semiconductor device assembly of claim 20, further comprising at least one spacer positioned between the at least one central semiconductor device and the first semiconductor device.

22. The semiconductor device assembly of claim 20, further comprising a third plurality of discrete conductive elements operably coupled to the central semiconductor device and the substrate.

23. The semiconductor device assembly of claim 20, further comprising a third plurality of discrete conductive elements operably coupled to a redistribution layer on an active surface of the first semiconductor device and the central semiconductor device.

24. The semiconductor device assembly of claim 20, further comprising:
  a third plurality of discrete conductive elements operably coupled to a redistribution layer on a back side surface of the first semiconductor device and the central semiconductor device; and
  a plurality of through hole vias within the first semiconductor device operably coupled to the redistribution layer.

25. The semiconductor device assembly of claim 19, further comprising a plurality of conductive bumps operably coupled to an active surface of the central semiconductor device and a redistribution layer on an active surface of the first semiconductor device, the redistribution layer operably coupled to at least some of the first plurality of discrete conductive elements.

26. The semiconductor device assembly of claim 19, further comprising:
  a plurality of conductive bumps operably coupled to an active surface of the central semiconductor device and a redistribution layer on a back side surface of the first semiconductor device; and
  a plurality of through hole vias within the first semiconductor device operably coupled to the redistribution layer.

27. The semiconductor device assembly of claim 1, further comprising at least one interconnect bump positioned on the second, opposing surface of the substrate, enabling electrical communication with external circuitry.

28. A semiconductor device assembly comprising:
  a first substrate having a first surface, a second, opposing surface, and at least one side surface adjacent to the first surface and the second, opposing surface;
  a first semiconductor device disposed on the first surface of the first substrate;
  a second substrate positioned on the first semiconductor device;
  a first plurality of conductive bumps operably coupled to the first semiconductor device and the second substrate;
  a central substrate operably coupled to the second substrate with a second plurality of conductive bumps;
  a second semiconductor device disposed over the first semiconductor device, the second semiconductor device having an active surface facing the first semiconductor device; and
  a plurality of discrete conductive elements operably coupled to the second semiconductor device active surface and the first substrate second surface, at least a portion of some of the second plurality of discrete conductive elements extending beyond the at least one side surface of the substrate.

29. A stacked semiconductor assembly comprising:
  a substrate having a first surface, a second, opposing surface, and at least one side surface adjacent to the first surface and the second, opposing surface;
  a first semiconductor device disposed on the first surface of the substrate;
  a first plurality of discrete conductive elements operably coupled to the first semiconductor device and the substrate;
  a second semiconductor device disposed over the first semiconductor device, the second semiconductor device having an active surface facing the first semiconductor device, at least a portion of the second semiconductor device active surface overhanging both the substrate and the first semiconductor device; and
  a second plurality of discrete conductive elements operably coupled to the at least a portion of the second semiconductor device active surface and the substrate second, opposing surface.

30. An electronic system including an input device, an output device, a circuit board, and a processor device coupled to the input and output devices, and the circuit board, the circuit board including a semiconductor device assembly comprising:
  a substrate having a first surface, a second, opposing surface, and at least one side surface adjacent to the first surface and the second, opposing surface;
  a first semiconductor device disposed on the first surface of the substrate;
  a first plurality of discrete conductive elements operably coupled to the first semiconductor device and the substrate;
  a second semiconductor device disposed over the first semiconductor device, the second semiconductor device having an active surface facing the first semiconductor device; and
  a second plurality of discrete conductive elements operably coupled to the second semiconductor device active surface and the substrate second surface, at least a portion of some of the second plurality of discrete conductive elements extending beyond the at least one side surface of the substrate.

* * * * *